United States Patent

Sakai et al.

Patent Number: 5,088,003
Date of Patent: Feb. 11, 1992

[54] LAMINATED SILICON OXIDE FILM CAPACITORS AND METHOD FOR THEIR PRODUCTION

[75] Inventors: Naomichi Sakai, Ayase; Masanaga Kikusawa, Ichikawa; Yoshitaka Kubota, Sagamihara; Hiroshi Yamamura; Hiroya Nagata, both of Yokohama, all of Japan

[73] Assignee: Tosoh Corporation, Shinnanyo, Japan

[21] Appl. No.: 568,994

[22] Filed: Aug. 17, 1990

[30] Foreign Application Priority Data

Aug. 24, 1989 [JP] Japan ................................. 1-216023
Aug. 31, 1989 [JP] Japan ................................. 1-223109
Oct. 5, 1989 [JP] Japan ................................. 1-258713

[51] Int. Cl.$^5$ ......................... H01G 4/38; H01G 7/00
[52] U.S. Cl. ................................. 361/330; 29/25.42
[58] Field of Search ............. 361/311, 312, 313, 304, 361/305, 303, 328–330; 29/25.42; 357/51

[56] References Cited

U.S. PATENT DOCUMENTS

| | | | |
|---|---|---|---|
| 3,113,253 | 12/1963 | Ishikawa et al. | 361/312 |
| 3,149,399 | 9/1964 | Sprague et al. | 29/25.42 |
| 3,259,558 | 7/1966 | Matsushita | 204/38 |
| 3,596,370 | 8/1971 | Gabrail | 361/311 |
| 4,464,700 | 8/1984 | Stenerhag et al. | 361/307 |
| 4,922,312 | 5/1990 | Coleman et al. | 357/23.6 |

FOREIGN PATENT DOCUMENTS

| | | |
|---|---|---|
| 356212 | 2/1990 | European Pat. Off. |
| 2832740 | 2/1979 | Fed. Rep. of Germany |
| 59-104156 | 6/1984 | Japan |
| 59-132644 | 7/1984 | Japan |

*Primary Examiner*—Donald A. Griffin
*Attorney, Agent, or Firm*—Oblon, Spivak, McClelland, Maier & Neustadt

[57] ABSTRACT

A laminated silicon oxide film capacitor including a conductive or semiconductive silicon substrate and, formed on the substrate surface, at least one laminated film comprising a silicon oxide layer and an electrode layer laminated one on the other, and electrodes.

9 Claims, 4 Drawing Sheets

LAMINATED SILICON OXIDE FILM CAPACITORS AND METHOD FOR THEIR PRODUCTION

BACKGROUND OF THE INVENTION FIELD OF THE INVENTION

The present invention relates to laminated silicon oxide film capacitors and a method for their production.

DISCUSSION OF THE BACKGROUND

Capacitors are parts necessary for forming electric and electronic circuits. Many capacitors are used for televisions, VTR, office appliances, etc.

Reflecting the recent trend for small sizes, high performance and low costs of appliances, capacitors as internal parts are also required to be small in their sizes and have a large capacity, a low dielectric loss, constant temperature and frequency characteristics of their capacities, and they are required to be inexpensive. Conventional capacitors include a temperature compensation laminated ceramic capacitor, a high dielectric constant laminated ceramic capacitor, a mica capacitor and a tantalum electrolytic capacitor. These capacitors are selected for use depending upon the particular application. Among them, the temperature compensation laminated ceramic capacitor is prepared by lamination by e.g. a green sheet method using a material excellent in the temperature characteristics and frequency characteristics of the capacity and the dielectric loss. However, to obtain a capacitor having a relatively small dielectric constant and a large capacity, it is necessary either to reduce the thickness per layer, or to increase the number of laminated layers. At present, the minimum thickness per layer attainable by the green sheet method is at best at a level of from 10 to 20 $\mu$m. If the thickness is further reduced, there will be a problem such as a deterioration of the voltage resistance, or insulation breakdown due to e.g. pinholes. Accordingly, in order to obtain a capacitor excellent in the temperature characteristics and the frequency characteristics of the capacity and the dielectric loss, the capacitor was obliged to be large in size.

On the other hand, a high dielectric constant laminated ceramic capacitor of a small size with a large capacity is available. However, this capacitor is not necessarily satisfactory with respect to the temperature characteristics and the frequency characteristics of the capacity and the dielectric loss. The mica condenser is excellent in the temperature characteristics and the frequency characteristics of the capacity and the dielectric loss. However, it has a drawback that the performance is not constant, since natural mica is used. Further, there is a limit in the thickness per layer. Therefore, in order to obtain a capacitor having a large capacity, it has to be made large in size.

As a small size large capacity capacitor excellent in the temperature characteristics and the frequency characteristics of the capacity and the dielectric loss, the tantalum electrolytic capacitor may be mentioned. However, this capacitor is an electrolytic capacitor, and therefore it has a problem of leak current or a problem that it has polarity. Further, tantalum used as the starting material is expensive and thus adds an economical problem.

Silicon oxide used in the present invention has been known as a material excellent in the frequency characteristics and the temperature characteristics of the dielectric constant and the dielectric loss. However, if this is employed as a usual single substance capacitor, the capacity thereby obtained is practically too small, since the dielectric constant is very low (about 4). Thus, silicon oxide had a drawback that it was thereby possible to produce capacitors with low capacities only. Therefore, silicon oxide used to be employed only as an insulating material for e.g. IC in this field.

SUMMARY OF THE INVENTION

It is an object of the present invention to solve such drawbacks of conventional capacitors and utilize the excellent frequency characteristics and temperature characteristics of silicon oxide to present a small size large capacity inexpensive laminated silicon oxide film capacitor excellent in the frequency characteristics and temperature characteristics by conducting filming and lamination by means of e.g. an oxide film method and a coating method and to provide a method for producing such a laminated film capacitor.

The film capacitor of the present invention comprises silicon oxide films and electrode films laminated on the surface of a semiconductive silicon substrate and characterized in that it has a structure wherein an electrode is taken out from every other layer inclusive of the silicon substrate. Further, as a method of producing such a capacitor, the present inventors have discovered a method wherein e.g. the first silicon oxide layer is formed by thermally oxidizing the silicon substrate surface, or by coating on the substrate surface a silicon oxide precursor capable of forming a silicon oxide layer by thermal treatment, followed by such thermal treatment; a method wherein the second or subsequent silicon oxide layer to be formed via an electrode layer, is formed by thermally treating a silicon oxide precursor capable of forming a silicon oxide layer by thermal treatment. Further, it has been found that a thick silicon oxide layer can be formed in a relatively short period of time by coating a silicon oxide precursor on the silicon oxide layer formed on the substrate surface by the thermal oxidation treatment and thermally treating the coated surface.

Furthermore, it has been found that a laminated capacitor comprising a dielectric film of silicon oxide formed on one side of a conductive substrate, and a plurality of film capacitors provided with electrodes, laminated on each of the other side of the substrate and the dielectric film, has a large electrostatic capacity with a relatively small size.

Now, the present invention will be described in further detail.

As the conductive substrate to be used in the present invention, a conductive or semiconductive silicon substrate having a low specific resistance, preferably a silicon substrate having a specific resistance of at most 0.1 $\Omega$·cm, is used. In a case where the first silicon oxide layer on the substrate is formed by an oxide film method of thermally oxidizing the silicon substrate surface, the silicon substrate surface is placed in an atmosphere having the oxygen partial pressure controlled or in a gas stream containing steam, and thermally treated at a high temperature of at least 800° C. for oxidation to form an oxide layer having a predetermined thickness. To obtain an oxide layer having a thickness of e.g. from 0.1 to 0.7 $\mu$m by the above method, the thermal treatment is conducted under an oxygen partial pressure of from 60 to 760 torr in an atmosphere of a water partial pressure of from 0 to 700 torr at a temperature of from 900° to 1200° C. for from 0.5 to 48 hours.

Then, an electrode layer is formed on the surface of this oxide layer. This is conducted by a usual method such as a sputtering method, a vapor deposition method, a coating method or a plating method to form an electrode layer durable against high temperature sintering, preferably an electrode layer of a platinum group metal. Here, in order to improve the bond strength between silicon oxide and the metal layer forming the electrode, it is preferred to form a bonding layer of e.g. Ni or Cr.

Otherwise, formation of the first silicon oxide layer on the silicon substrate surface can be conducted by coating a silicon oxide precursor capable of forming a silicon oxide layer by thermal treatment and then heating the coated precursor to form a silicon oxide layer.

This method of conducting the formation of a silicon oxide layer by a coating method, :.s applied also to a case wherein after forming the first silicon oxide layer and an electrode layer by the thermal oxidation method or by a coating method, a second or subsequent silicon oxide layer is to be formed.

In this coating method, firstly, the silicon oxide precursor capable of forming a silicon oxide layer by thermal treatment, such as an organic silicon compound, specifically a solution having tetramethoxysilane, tetra-n-propoxysilane, tetrabutoxysilane or the like dissolved in a solvent such as ethanol, propanol, butanol or the like, preferably such a solution having a concentration of at least 1 mol%, is coated on the surface of a silicon substrate or an electrode layer by spin coating or dip coating, and the coated surface is then dried to remove the solvent from the silicon oxide precursor. This coating and drying operation is repeated until a necessary layer thickness is obtained. Then, the thermal treatment is conducted to form a silicon oxide layer. The thickness of the layer by this coating method, can be controlled by the number of repetition of the coating and drying operation, by the concentration of the precursor solution or by the coating speed. The drying of the precursor layer is preferably conducted at a temperature of at least 200° C., and the thermal treatment is preferably conducted at a temperature of at least 600° C. The thermal treatment can be conducted in atmospheric air, and the time for the thermal treatment is usually at least 10 minutes. Further, in order to increase the number of laminated electrode layers and silicon oxide layers, the above-mentioned step of forming an electrode layer and the step for forming a silicon oxide layer by a coating method are repeated a desired number of times to obtain a silicon oxide film laminate. In such a case, the uppermost surface layer is preferably an electrode layer.

The first silicon oxide layer to be formed on the surface of a silicon substrate, may be formed either by the thermal oxidation method or the coating method. However, the oxidation method is preferred since it is relatively easy as a technique commonly employed for the preparation of silicon semiconductors can be employed, and the process can be simplified.

The silicon oxide layer and the electrode layer obtained by the above-mentioned methods, have thicknesses of from 0.03 to 0.8 μm and from 0.03 to 0.1 μm, respectively.

In a case where the silicon oxide layer is formed by thermal oxidation followed by a coating method, the thermal oxidation may be conducted under the same conditions as described above, and then the coating and drying may be conducted under the same conditions as described above. In a case where the thickness of the layer formed by this coating is at most 0.5 μm, such a thickness may be adjusted by controlling the number of repetitions of the coating and drying operation, the concentration of the precursor solution or the coating speed. In a case where the thickness is more than 0.5 μm, such a thickness may be controlled by repeating the coating-drying-thermal treatment operation a necessary number of times after the thermal treatment of the coated layer.

In such a manner, a silicon oxide film having a thickness within a range of from 0.03 to 1.5 μm is usually obtained, and electrodes of e.g. Al are provided to the outermost layer of the silicon oxide film and the silicon substrate to form a capacitor.

The electrodes of the capacitor according to the film capacitor of the present invention have a construction in which electrodes are taken out in parallel from every other layer inclusive of the silicon substrate.

BRIEF DESCRIPTION OF THE DRAWINGS

Now, the laminated capacitors of the present invention will be described in further detail with reference to the drawings.

In the accompanying drawings.

DESCRIPTION OF THE PREFERRED EMBODIMENTS

Figure 4:
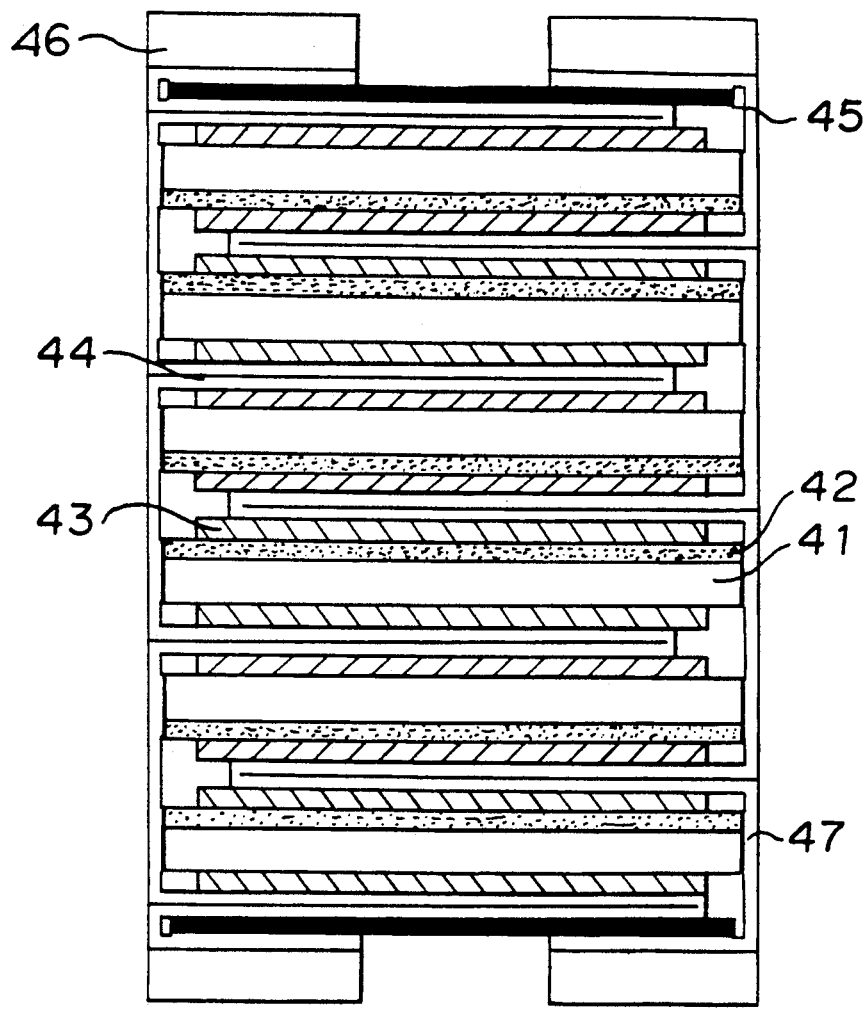
FIG. 4 is a diagrammatical view of a capacitor wherein a plurality of silicon oxide film capacitors are laminate.
Figure 5:
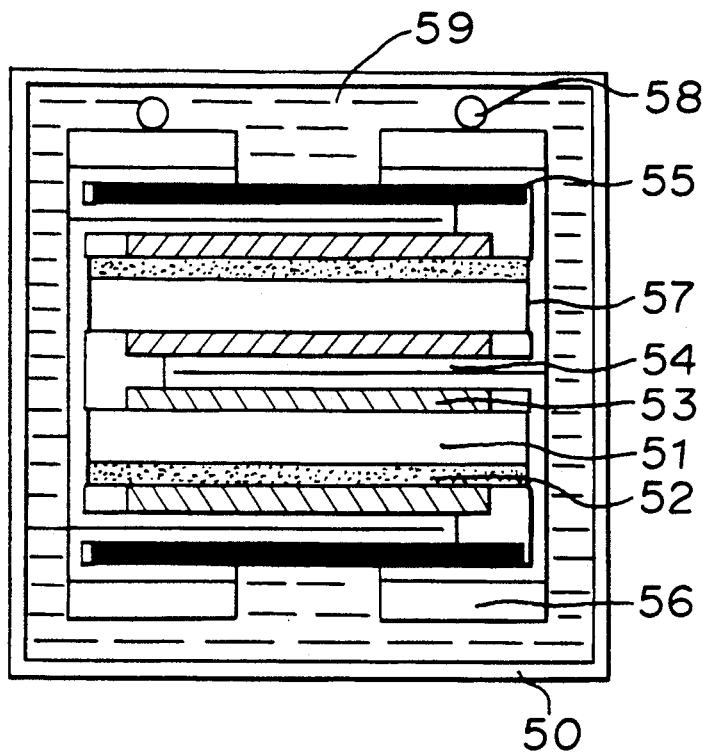
FIG. 5 is a diagrammatical view of the laminated capacitor as described in the Examples.

FIGS. 4 and 5 are views illustrating one embodiment of the present invention. In FIG. 4, reference numeral 41 indicates a silicon substrate, numeral 42 indicates silicon oxide, numeral 43 indicates a vapor-deposited metal layer, numeral 44 indicates a soft metal foil, numeral 45 indicates an insulating sheet, numeral 46 indicates an external electrode, and numeral 47 indicates an insulating resin. In FIG. 5, reference numeral 51 indicates a silicon substrate, numeral 52 indicates silicon oxide, numeral 53 indicates a vapor deposited aluminum layer, numeral 54 indicates Sn foil, numeral 55 indicates a mica sheet, numeral 56 indicates a Sn-plated Cu sheet, numeral 57 indicates an epoxy resin, numeral 58 indicates a solder-plated soft copper wire, numeral 59 indicates a phenol resin, and numeral 50 indicates an epoxy resin. In the structure of the laminated capacitor of the present invention, the single silicon oxide film capacitor as its basic unit structure comprises a conductive substrate (41 in FIG. 4) and a silicon oxide layer (42 in FIG. 4) formed on one side of the conductive substrate.

The conductive substrate to be used here, is preferably a silicon substrate as described above.

To form such a silicon oxide layer on the substrate surface, it is preferred to employ a method wherein the substrate is thermally treated in an oxygen atmosphere as described above, or in an atmosphere having an oxygen partial pressure controlled with an inert gas or in a gas stream containing steam, to oxidize the surface in an extremely thin depth, or a method wherein a silica sol obtained by the hydrolysis of a silicon alkoxide, is coated on the substrate by e.g. spin coating or dip coating, followed by thermal treatment to form a silicon oxide layer.

In the former thermal oxidation method, the thermal treatment is conducted in a steam gas stream using oxygen as a carrier gas, when a relatively thick silicon oxide layer is to be obtained. In this case, the thermal treatment may be conducted in an atmosphere having a steam partial pressure of from 400 to 700 torr at a temperature of from 900° to 1150° C. for from 0.5 to 48 hours.

On the other hand, in a case where a thin silicon oxide layer is to be formed, the treatment is conducted in an oxygen atmosphere or in an atmosphere having the oxygen partial pressure controlled with an inert gas. The inert gas to be used here, is preferably argon. In this case, the treatment is conducted in an atmosphere having an oxygen partial pressure of from 760 to 30 torr and an inert gas of from 0 to 730 torr at a temperature of from 850° to 1050° C. for from 0.5 to 12 hours.

In the latter method, it is possible to obtain a silicon oxide layer having a desired thickness by controlling the concentration of the silica sol or the thickness of the coated layer. However, in either method, the substrate obtained will be the one treated under a heated condition, and the substrate will have a silicon oxide layer formed on each side thereof. Therefore, when an electrode is provided on each side to form a capacitor, the electrostatic capacity will be about ½ as compared with a case where a capacitor is prepared to have a dielectric layer only on one side of the substrate.

In such a case, it is preferred to remove the layer on one side by etching by means of e.g. a silicon oxide HF—NH$_4$F solution. Further, a metal layer (43 in FIG. 4) of e.g. Al, Ni or Au is formed by e.g. vapor deposition, as an electrode on each side i.e. on the silicon oxide surface and on the silicon surface, to obtain a single silicon oxide film capacitor. A desired number of such single silicon oxide film capacitors obtained as described above, will be laminated taking into consideration the electrostatic capacity per single capacitor and the electrostatic capacity desired for the final capacitor. For such lamination, single film capacitors are preferably overlaid so that the same sides of the adjacent capacitors face each other. Here, the same sides mean the sides having, for example, silicon oxide layers formed thereon.

When single silicon oxide film capacitors are to be laminated, soft metal foils (44 in FIG. 4) are interposed between the respective adjacent layers, and the soft metal foils of adjacent layers are alternately connected to different poles of external electrodes (46 in FIG. 4). The soft metal foils used here are preferably Al, Sn or Pb. As the external electrodes, a relatively hard metal such as Cu is used, since they have also a role of fixing the entire laminated structure to maintain the contact between the respective layers in a good condition. In such a case, if Cu plated with Sn or Pb is used as external electrodes, connection of the lead wire for the lead-type capacitor as shown in FIG. 5 will be easy. Further, as shown in FIG. 5, the entire laminated structure may be dipped in a phenol resin to form an outer coating (59 in FIG. 5), followed by impregnation of e.g. an epoxy resin to form an outer cover (50 in FIG. 5) thereby to obtain a structure excellent in the weather resistance, as commonly employed for the preparation of e.g. a dip mica capacitor.

According to the present invention, the laminated silicon oxide film capacitor employs silicon oxide as the material and thus has excellent frequency characteristics and temperature characteristics inherent to silicon oxide, and film formation and lamination can be simplified, so that it is possible to present a capacitor of a small size having a large capacity. Further, the cost will be reduced by using silicon as the substrate.

For a laminated capacitor, the electrostatic capacity, the number of laminated layers and the size are determined by the thickness of the dielectric layers. In the capacitor of the present invention, the thickness of the silicon oxide layers as dielectric layers can be controlled within a range of from 0.05 to 2 μm by forming the silicon oxide layers by the above described method. Therefore, the electrostatic capacity of a single silicon oxide film capacitor can be made large in spite of the fact that the specific inductive capacity of silicon oxide is as small as about 4. Therefore, as compared with the conventional mica capacitor, it is possible to obtain a capacitor having an equal or higher electrostatic capacity with a smaller number of laminated layers. Further, silicon oxide has a small dissipation factor and a high Q-value, and the temperature dependency of the dielectric constant is extremely small. Further, it has a feature that the dielectric constant at a low or intermediate frequency region is maintained also at a high frequency region. Thus, the laminated capacitor of the present invention employing as dielectric a silicon oxide film having the above-mentioned thickness and electrical characteristics, sufficiently solves the above-mentioned problems.

Further, according to the present invention in which the dielectric layers are formed by a combination of an oxide film method and a coating method, it is possible to obtain a capacitor having relatively thick silicon oxide layers in a short period of time as compared with a method of forming such layers by the oxide film method only or by the coating method only. Further, even if a defect such as a pinhole is formed on the layer obtained by the oxide film method, such a defect can be complemented by forming a layer by the coating method on the oxide layer, whereby a constant film can be obtained.

Now, the present invention will be described in further detail with reference to Examples. However, it should be understood that the present invention is by no means restricted to such specific Examples.

EXAMPLE 1

Figure 1:
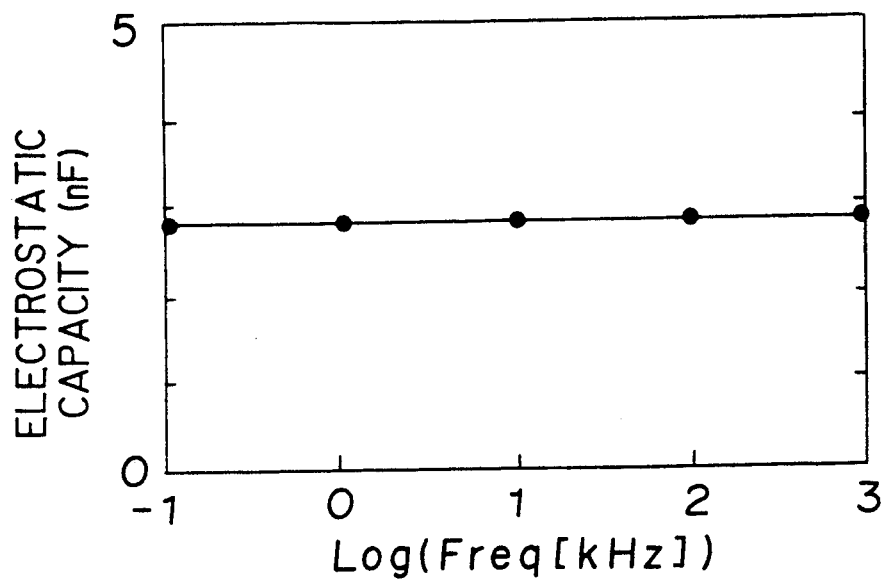
FIG. 1 shows the capacity-frequency characteristics of the laminated silicon oxide film capacitor of Example 1 of the present invention.
Figure 2:
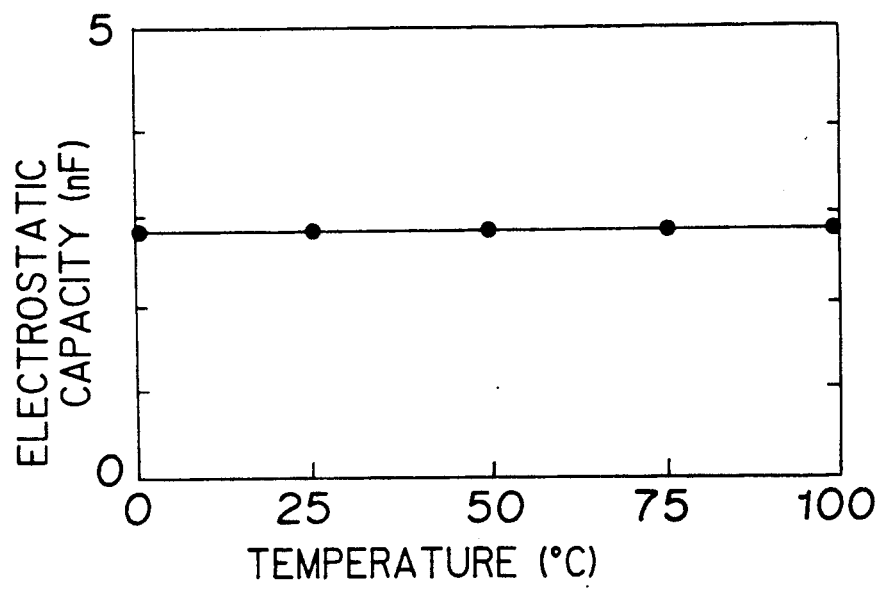
FIG. 2 shows the capacity-temperature characteristics of the same capacitor.
Figure 3:
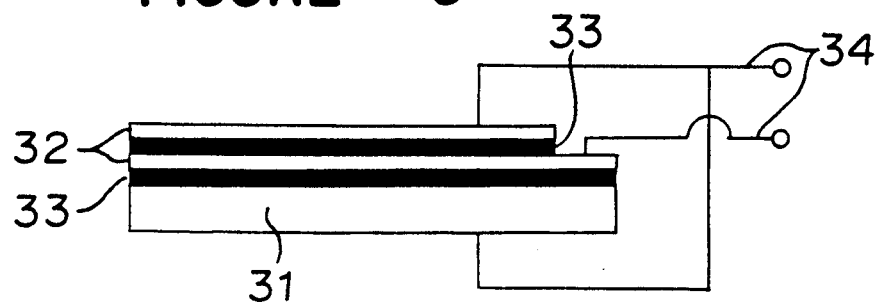
FIG. 3 shows a cross-sectional illustration of the laminated silicon oxide film capacitor according to one embodiment the present invention.

A semiconductive silicon substrate having a specific resistance of 0.01 Ω·cm was used as the conductive substrate. The silicon substrate was thermally treated at 1050° C. for one hour in a gas stream of oxygen gas passed through warm water of 95° C. and flowing at a rate of 3 l/min, to obtain a silicon oxide layer of 0.3 μm. On the surface of the obtained silicon oxide layer, a Ni/Pt electrode was formed by a usual sputtering method to obtain a substrate for film-forming by a sol-gel method. As a silicon oxide precursor solution, a solution obtained by mixing tetraethoxysilane, water and propyl alcohol in a molar ratio of 1/6/10, was employed, and coating and drying were repeated three times, respectively. Here, the coating was conducted by spin coating at a rate of 5000 rpm, and the drying was conducted at 300° C. for one minute. Further, sintering was conducted at 900° C. for 20 minutes to obtain a silicon oxide layer of 0.3 μm. Then, Al electrode was formed on the surface of the silicon oxide layer, and a part thereof was subjected to etching with a HF solution to expose the Pt electrode. As shown in FIG. 3, the substrate and the surface electrode were connected, and an electrode was taken out in parallel with the internal electrode, to obtain a laminated silicon oxide film capacitor. In FIG. 3, reference numeral 31 indicates a silicon substrate, numeral 32 indicates an electrode layer, numeral 33 indicates a silicon oxide layer and numeral 34 indicates an electrode. The electrostatic capacity-frequency characteristics and the electrostatic capacity-temperature characteristics of the laminated silicon oxide film capacitor thus obtained are shown in FIGS. 1 and 2, respectively. As shown in the Figures, it was possible to obtain a laminated silicon oxide film capacitor excellent in the electrostatic capacity-frequency characteristics and the electrostatic capacity-temperature characteristics.

EXAMPLE 2

A commercially available n-type semiconductive silicon substrate (thickness: 0.4 mm) was employed as the conductive substrate. The crystal axis of this silicon substrate was (100), and the specific resistance was $5 \times 10^{-2}$ Ω·cm. This substrate was thermally treated under the conditions as shown in Table 1 in a diffusion furnace.

In order to remove $SiO_2$ from one side of the silicon substrate having the surface oxidized, a solution obtained by mixing concentrated hydrofluoric acid and a 8N ammonium fluoride solution in a volume ratio of 12:100, was used as an etching solution, and $SiO_2$ was removed by etching. On both sides of this substrate, Al was vapor-deposited by a vapor deposition method to form electrodes. The electrostatic capacity and the dissipation factor of the single $SiO_2$ film capacitor obtained by the above process were as shown in Table 1 when the electrode surface was 12 mm².

Two sheets of the single $SiO_2$ film capacitor of Sample No. 3 in Table 1 i.e. the one having an electrostatic capacity of 5000 pF, were laminated with a Sn foil (1) having a thickness of 0.1 mm interposed, so that the Al vapor-deposited surfaces faced to each other, and mica was laminated on each side of this laminate with a Sn foil (2) having a thickness of 0.1 mm interposed therebetween. The Sn foils (1) and (2) were connected to separate external electrodes, respectively. As the external electrodes, Cu of 0.3 mm plated with Sn was used, and the laminated structure was fixed by the external electrodes. To both external electrodes of this laminate, soft copper wires having a wire diameter of 0.4 mm and provided with solder plating were attached. Then, the laminate was dipped in a phenol resin to form an outer coating, and then dipped in an epoxy resin to form an outer cover.

The electrostatic capacity and the dissipation factor at 1 kHz and 1 MHz of the laminated capacitor thus obtained, were determined by means of a vector impedance meter. The results of the measurements are shown in Table 2. Further, the temperature dependency of the electrostatic capacity at 1 kHz was examined within a range of from −20° to 100° C. The results are shown in Table 3.

EXAMPLE 3

Figure 8:
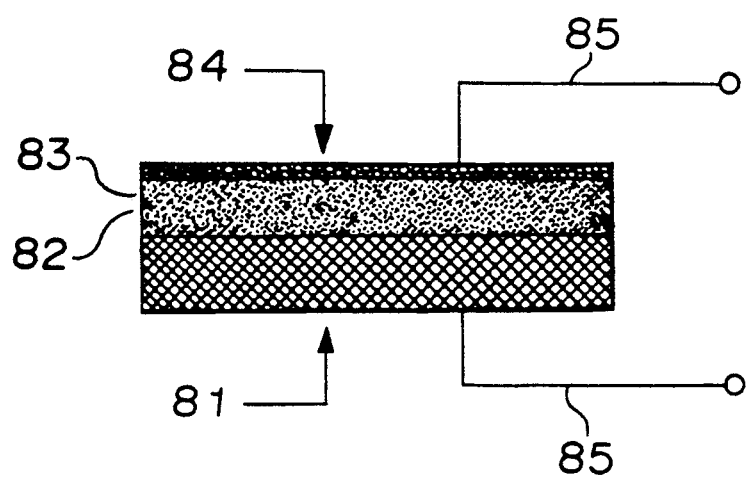
FIG. 8 is a cross-sectional view of a silicon oxide film capacitor according to one embodiment of the present invention.

A semiconductive silicon substrate having a specific resistance of 0.01 ohm·cm was employed as the conductive substrate, and the substrate was thermally treated at 1100° C. for 6 hours in a gas stream of oxygen gas passed through a warm water of 95° C. and flowing at a rate of 3 l/min, to obtain a silicon oxide layer of 0.7 μm. As a silicon oxide precursor solution, a solution obtained by mixing tetraethoxysilane/water/propyl alcohol in a molar ratio of 1/6/10, was employed, and coating and drying were repeated three times. Here, the coating was conducted by spin coating at 5000 rpm, and the drying was conducted at 300° C. for one minute. The coated layer thus obtained was further sintered at 900° C. for 20 minutes to obtain a silicon oxide layer of 0.3 μm by a coating method. Then, a coating-drying-thermal treatment process was repeated one more time to form a silicon oxide film having an overall thickness of 1.3 μm. Then, the rear side of the substrate was etched with a hydrofuran solution to remove silicon, and an Al electrode was attached to its surface and to the surface of the silicon oxide layer. Then, as shown in FIG. 8, the substrate and the surface electrode were connected to obtain a silicon oxide film capacitor.

TABLE 1

| No. | Conditions for thermal treatment | | | Electrostatic capacity (pF) | | Dissipation factor (%) | |
|---|---|---|---|---|---|---|---|
| | Temp. (°C.) | Time (hr) | Ambient gas | 1 kHz | 1 MHz | 1 kHz | 1 MHz |
| 1 | 850 | 2 | $O_2$ | 11000 | 10000 | 0.05 | 2.0 |
| 2 | 900 | 2 | $O_2$ | 7200 | 7000 | 0.03 | 1.5 |
| 3 | 950 | 2 | $O_2$ | 5000 | 4950 | 0.02 | 0.8 |
| 4 | 950 | 2 | Ar + $O_2$* | 10000 | 9900 | 0.05 | 2.0 |
| 5 | 1000 | 2 | Ar + $O_2$* | 7500 | 7450 | 0.03 | 1.4 |
| 6 | 1050 | 24 | Steam stream | 850 | 850 | 0.01 | 0.2 |
| 7 | 1100 | 24 | Steam stream | 750 | 750 | 0.01 | 0.2 |

The composition of the ambient gas with an asterisc * in Table 1 was Ar:$O_2$ = 90:10 (vol %).

TABLE 2

| Electrostatic capacity (pF) | | Dissipation factor (%) | |
|---|---|---|---|
| 1 kHz | 1 MHz | 1 kHz | 1 MHz |
| 9980 | 9900 | 0.05 | 1.0 |

TABLE 3

| Temp (°C.) | Electrostatic capacity (pF) | Dissipation factor (%) |
|---|---|---|
| −20 | 9980 | 0.05 |
| 0 | 9980 | 0.05 |
| 20 | 9980 | 0.05 |
| 40 | 9980 | 0.05 |
| 60 | 9980 | 0.06 |
| 80 | 9980 | 0.05 |
| 100 | 9980 | 0.06 |

Figure 6:
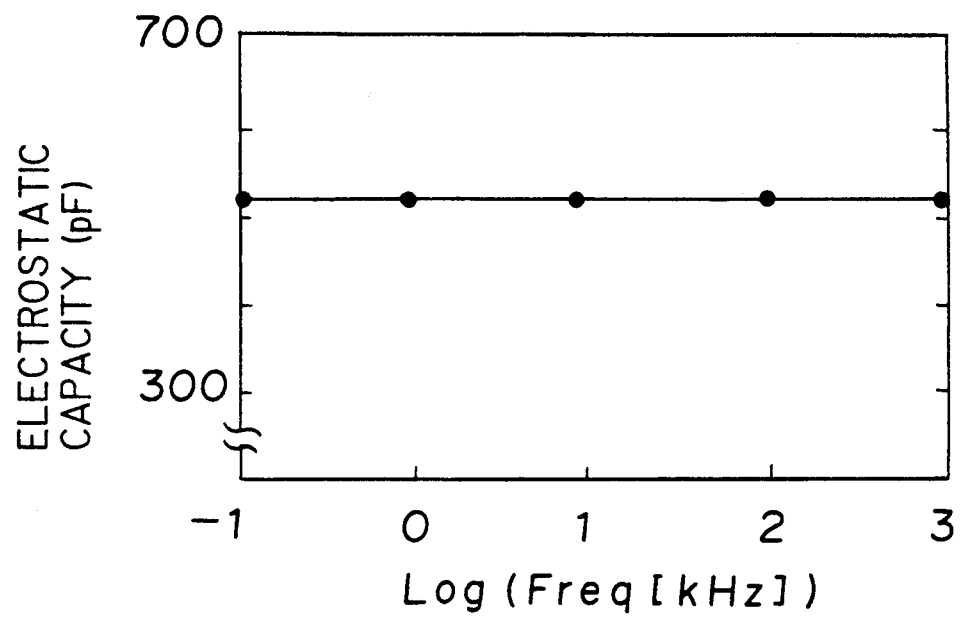
FIG. 6 shows the capacity-frequency characteristics of the silicon oxide film capacitor obtained in Example 3 of the present invention.
Figure 7:
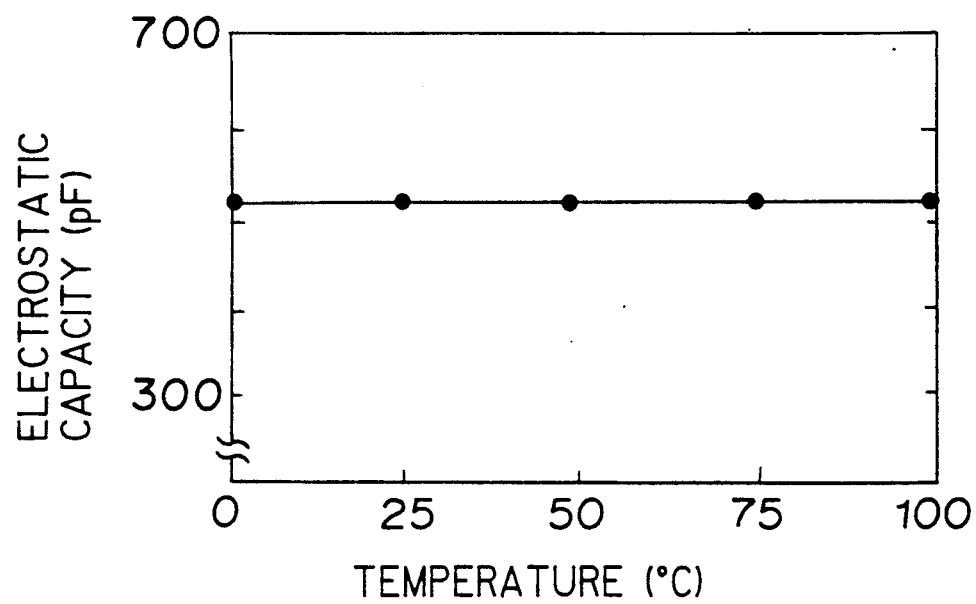
FIG. 7 shows the capacity-temperature characteristics of the same.

The electrostatic capacity-frequency characteristics and the electrostatic capacity-temperature characteristics of the silicon oxide film capacitor thus obtained are shown in FIGS. 6 and 7, respectively.

As is apparent from the Figures, according to the method of the present invention, it was possible to obtain a silicon oxide film capacitor excellent in the electrostatic capacity-frequency characteristics and the electrostatic capacity-temperature characteristics. In FIG. 8, reference numeral 81 indicates a silicon substrate, numeral 82 indicates a silicon oxide layer formed by an oxide film method, numeral 83 indicates a silicon oxide layer formed by a coating method, numeral 84 indicates an electrode layer, and numeral 85 indicates an electrode.

We claim:

1. A laminated silicon oxide film capacitor, comprising:

a plurality of single silicon oxide film capacitors, each having an oxide layer disposed on a conductive or semiconductive substrate and first and second conductive layers respectively formed on said oxide layer and said substrate;

a first electrode electrically connected to each of said first conductive layers;

a second electrode electrically connected to each of said second conductive layers; and first and second external electrodes respectively connected to said first and second electrodes;

wherein said plurality of capacitors are laminated such that said first conductive layers of adjacent capacitors oppose each other and said first electrode is disposed between adjacent of said first conductive layers, and such that said second conductive layers of adjacent capacitors oppose each other and said second electrode is disposed between adjacent of said second conductive layers to obtain a parallel connection of said plurality of capacitors.

2. A capacitor as recited in claim 1, comprising said first and second electrodes being made of a soft metal foil.

3. A capacitor as recited in claim 1, comprising: said oxide layer being a thermal oxide layer.

4. A capacitor as recited in claim 1, comprising: said oxide layer being a silicon oxide precursor deposited then thermally treated to form a silicon oxide layer.

5. A capacitor as recited in claim 1, comprising: said oxide layer being a thin thermal oxide layer having a silicon oxide layer disposed thereon formed by depositing and thermally treating a silicon oxide precursor.

6. A method of producing a laminated film capacitor, comprising:

forming a plurality of silicon oxide film capacitors, each of said plurality of capacitors being formed by oxidizing a conductive or semiconductive substrate to form a silicon oxide layer thereon, and forming first and second conductive layers on said silicon oxide layer and said substrate, respectively;

laminating said plurality of capacitors such that each of said first conductive layers of adjacent of said plurality of capacitors, and each of said second conductor layers of adjacent of said plurality of capacitors oppose each other;

forming a first electrode electrically connected to each of said first conductive layers and disposed between adjacent of said first conductive layers;

forming a second electrode electrically connected to each of said second conductive layers and disposed between adjacent of said second conductive layers, thereby obtaining a parallel connection of said plurality of capacitors; and forming first and second external electrodes respectively connected to said first and second electrodes.

7. A method as recited in claim 6, comprising: forming said first and second electrodes using a soft metal foil.

8. A method as recited in claim 6, wherein forming said oxide layer comprises:

oxidizing said substrate to form a thin thermal oxide layer;

depositing a silicon oxide precursor on said thin thermal oxide layer; and thermally treating said deposited silicon oxide precursor.

9. A method as recited in claim 8, comprising: repeating said depositing and thermal treating steps to obtain a silicon oxide layer having a desired thickness.

* * * * *